(12) United States Patent
Tsai et al.

(10) Patent No.: US 10,193,022 B2
(45) Date of Patent: Jan. 29, 2019

(54) PIXEL STRUCTURE AND DISPLAY APPARATUS HAVING THE SAME

(71) Applicant: E Ink Holdings Inc., Hsinchu (TW)

(72) Inventors: Xue-Hung Tsai, Hsinchu (TW); Wei-Tsung Chen, Hsinchu (TW); Henry Wang, Hsinchu (TW); Po-Hsin Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/815,718

(22) Filed: Nov. 17, 2017

(65) Prior Publication Data
US 2018/0323342 A1 Nov. 8, 2018

(30) Foreign Application Priority Data

May 5, 2017 (CN) .......................... 2017 1 0310752

(51) Int. Cl.
*H01L 29/92* (2006.01)
*H01L 33/36* (2010.01)
(Continued)

(52) U.S. Cl.
CPC .......... *H01L 33/36* (2013.01); *G09G 3/3655* (2013.01); *H01L 27/3244* (2013.01);
(Continued)

(58) Field of Classification Search
CPC ..... H01L 27/3265; H01L 28/40; H01L 33/36; H01L 33/38; H01L 33/44; H01L 27/3244;
(Continued)

(56) References Cited

U.S. PATENT DOCUMENTS 6,057,896 A * 5/2000 Rho .................. G02F 1/133345
257/59
6,583,828 B1 * 6/2003 Wada ................ G02F 1/136213
349/38
(Continued)

FOREIGN PATENT DOCUMENTS

EP          1912095      * 10/2007 ........... G02F 1/1362
JP         H8-160462      * 6/1996 ............. G02F 1/136
(Continued)

OTHER PUBLICATIONS

Machine translation, Wang, Taiwanese Pat. Pub. No. TW 2009-31116, translation date: May 15, 2018, Espacenet, all pages.*
(Continued)

*Primary Examiner* — Victoria K Hall
(74) *Attorney, Agent, or Firm* — CKC & Partners Co., Ltd.

(57) ABSTRACT

A pixel structure includes a substrate, a gate electrode disposed on the substrate, a capacitor electrode disposed on the substrate, a first insulation layer, an active layer disposed on the first insulation layer, a drain electrode, a source electrode and an extension electrode. The capacitor electrode is spaced apart from the gate electrode. The first insulation layer covers the gate electrode and the capacitor electrode. The first insulation layer has a recess vertically above the capacitor electrode. The drain and the source electrodes are disposed on the active layer and spaced apart from each other. The extension electrode extends from the drain electrode or the source electrode into the recess.

19 Claims, 5 Drawing Sheets

(51) Int. Cl.
- *H01L 27/32* (2006.01)
- *H01L 49/02* (2006.01)
- *G09G 3/36* (2006.01)
- *H01L 51/52* (2006.01)

(52) U.S. Cl.
CPC .......... *H01L 27/3265* (2013.01); *H01L 28/40* (2013.01); *G09G 2300/0439* (2013.01); *H01L 51/52* (2013.01)

(58) Field of Classification Search
CPC ... H01L 51/52; H01L 51/5237; G09G 3/3655; G09G 2300/0439
See application file for complete search history.

(56) References Cited

U.S. PATENT DOCUMENTS

| | | | |
|---|---|---|---|
| 6,738,107 B2 | 5/2004 | Nagase et al. | |
| 9,997,581 B2* | 6/2018 | Kim | H01L 27/3248 |
| 10,056,444 B2* | 8/2018 | Cho | H01L 27/3258 |
| 10,074,710 B2* | 9/2018 | Ebisuno | H01L 27/3216 |
| 2006/0220014 A1* | 10/2006 | Hirano | G02F 1/136213 257/59 |
| 2016/0141349 A1* | 5/2016 | Yun | H01L 27/3272 257/40 |
| 2017/0098669 A1* | 4/2017 | Tsuno | H01L 27/1255 |
| 2017/0213650 A1* | 7/2017 | Fishburn | H01G 4/385 |
| 2017/0323910 A1* | 11/2017 | Park | H01L 27/1255 |

FOREIGN PATENT DOCUMENTS

| | | |
|---|---|---|
| TW | 200931116 A | 7/2009 |
| TW | 201227813 A | 7/2012 |
| TW | 201627736 A | 8/2016 |

OTHER PUBLICATIONS

Machine translation, Nishikawa, Japanese Pat. Pub. No. JP H8-160462, translation date: Sep. 28, 2018, Espacenet, all pages.*
Corresponding Taiwanese Notice of Allowance dated Oct. 23, 2017.

* cited by examiner

PIXEL STRUCTURE AND DISPLAY APPARATUS HAVING THE SAME

RELATED APPLICATIONS

This application claims priority to China Application Serial Number 201710310752.1, filed May 5, 2017, which is herein incorporated by reference.

BACKGROUND

Technical Field

The present disclosure relates to a display apparatus. More particularly, the present disclosure relates to a pixel structure of a display apparatus.

Description of Related Art

If a display panel is driven by high voltage, the devices of the display panel are always required in greater sizes, such as larger gate, source and/or drain electrodes, to withstand the high voltage. However, these large devices would induce considerable parasitic capacitance, such as capacitance generated from a large gate electrode and a large drain electrode. The considerable parasitic capacitance results in increase of feed through voltage of the display panel. However, the increase of the feed through voltage would adversely affect the display panel.

SUMMARY

Embodiments of the present disclosure can reduce feed through voltage of the display apparatus.

In some embodiments of the present disclosure, a pixel structure includes a substrate, a gate electrode, a capacitor electrode, a first insulation layer, an active layer, a drain electrode, a source electrode and an extension electrode. The gate electrode is disposed on the substrate. The capacitor electrode is disposed on the substrate and spaced apart from the gate electrode. The first insulation layer covers the gate electrode and the capacitor electrode. The first insulation layer has a recess vertically above the capacitor electrode. The active layer is disposed on the first insulation layer. The drain and the source electrodes are disposed on the active layer and spaced apart from each other. The extension electrode extends from the drain electrode or the source electrode into the recess.

In some embodiments of the present disclosure, a pixel structure includes a substrate, a gate electrode, a capacitor electrode, a first insulation layer, an active layer, a drain electrode and a source electrode. The gate electrode is disposed on the substrate. The capacitor electrode is disposed on the substrate and spaced apart from the gate electrode. The first insulation layer covers the gate electrode and the capacitor electrode. A thickness of the first insulation layer vertically above the gate electrode is greater than that vertically above the capacitor electrode. The active layer is disposed on the first insulation layer. The drain and the source electrodes are disposed on the active layer and spaced apart from each other.

In some embodiments, a display apparatus includes a pixel structure and a display layer over the pixel structure. The pixel structure is the same as that which is described above in some embodiments.

In these embodiments, the capacitor electrode and the extension electrode can generate storage capacitance. Because the first insulation layer has the recess vertically above the capacitor electrode, and the extension electrode extends into the recess, a distance from the extension electrode to the capacitor electrode can be shortened due to the recess, and hence the storage capacitance can be increased. Since the feed through voltage of the display apparatus is in negative correlation with the storage capacitance, the increase of storage capacitance can be beneficial in reducing the feed through voltage.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
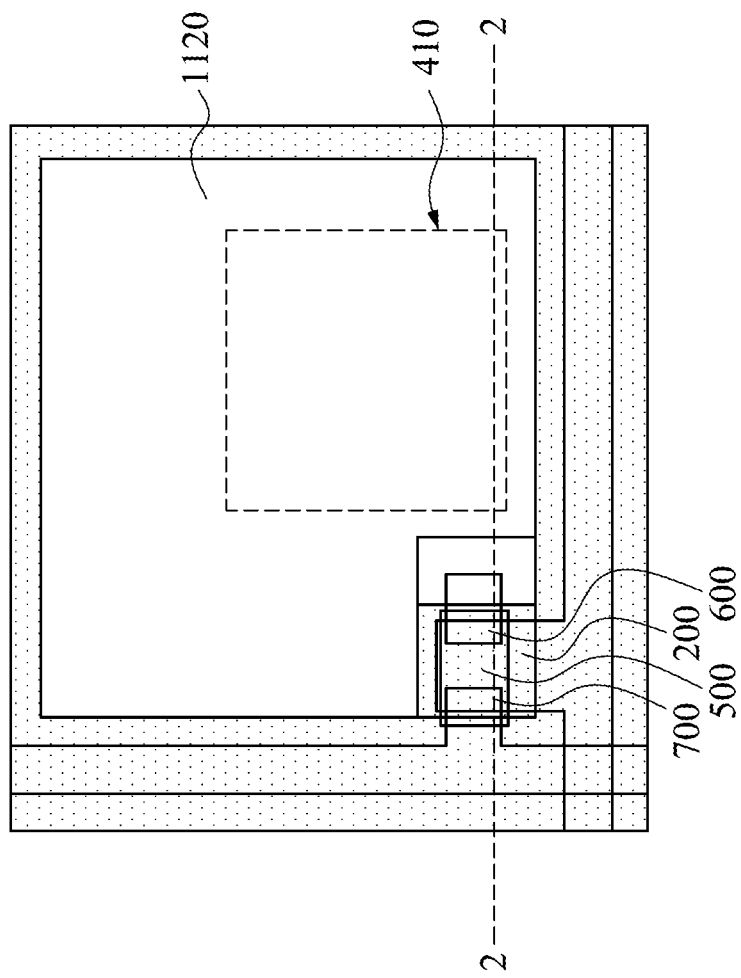
FIG. 1 is top view of a display apparatus in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
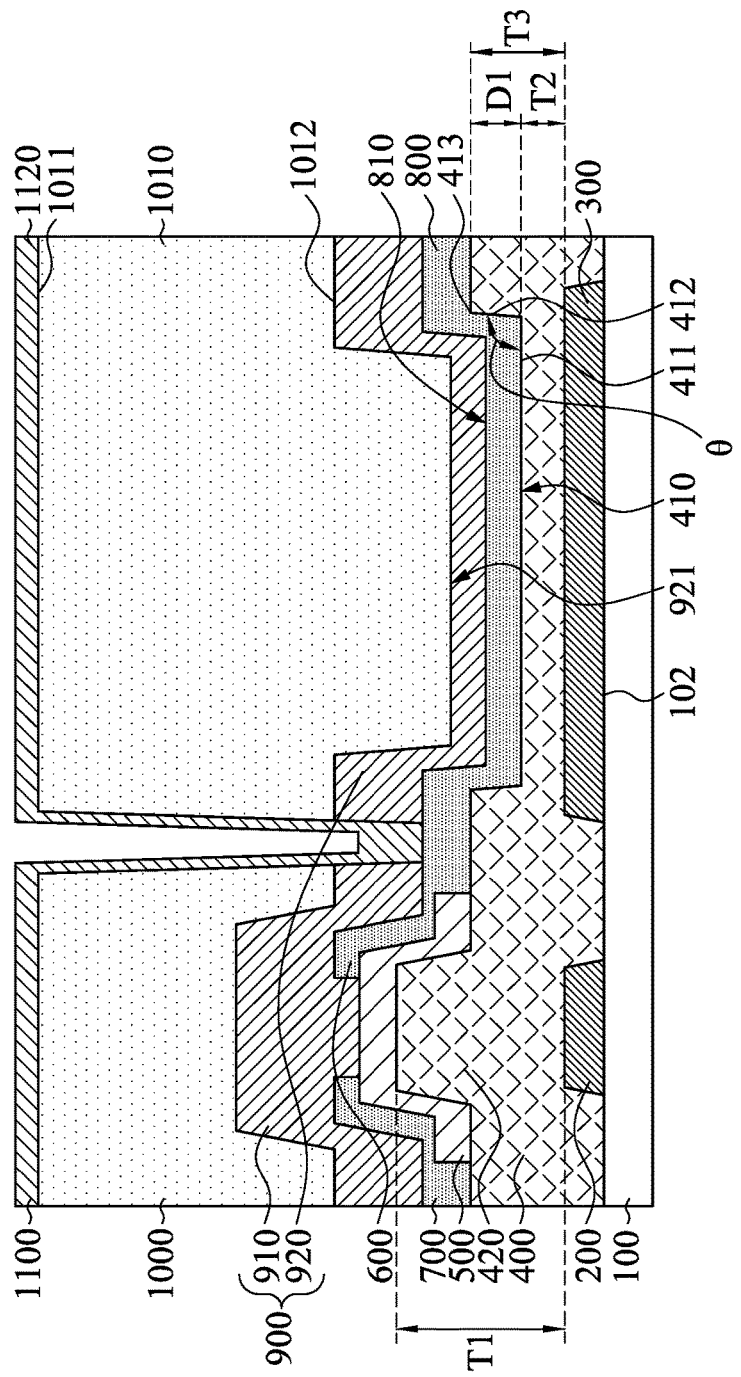
FIG. 2 is a cross-sectional view of the display apparatus taken along line 2 in FIG. 1.

FIG. 1 is top view of a display apparatus in accordance with some embodiments of the present disclosure. FIG. 2 is a cross-sectional view of the display apparatus taken along line 2 in FIG. 1. As shown in FIGS. 1 and 2, in the embodiments, the display apparatus includes a pixel structure that includes a substrate 100, a gate electrode 200, a capacitor electrode 300, a first insulation layer 400, an active layer 500, a drain electrode 600, a source electrode 700 and an extension electrode 800. The gate electrode 200 and the capacitor electrode 300 are disposed on the substrate 100 and spaced apart from each other. For example, the gate electrode 200 and the capacitor electrode 300 can be disposed on the same surface of the substrate 100 (e.g. top surface 102 of the substrate 100) and can be separated by a distance. In some embodiments, the gate electrode 200 and the capacitor electrode 300 can be formed in the same process and thus include the same material. The first insulation layer 400 covers the gate electrode 200 and the capacitor electrode 300.

The drain electrode 600 and the source electrode 700 are disposed on the active layer 500 and spaced apart from each other. As shown in FIG. 2, the gate electrode 200, the first insulation layer 400, the active layer 500, the drain electrode 600 and the source electrode 700 can in combination act as a thin film transistor (TFT) suitable for driving the display apparatus. As shown in FIG. 2, the first insulation layer 400 spaces the capacitor electrode 300 and the extension electrode 800 apart. In other words, the capacitor electrode 300 and the extension electrode 800 can be on opposite sides (e.g. top and bottom sides) of the first insulation layer 400 and insulated by the first insulation layer 400. As a result of separation of the capacitor electrode 300 and the extension electrode 800, the capacitor electrode 300 and the extension electrode 800 can in combination act as a storage capacitor in a parallel-plate manner.

It is understood that the feed through voltage ΔV of the display apparatus satisfies an equation of $$\Delta V = \frac{C_{gd}}{C_S + C_{FPL} + C_{gd}}(V_{gh} - V_{gl}),$$

wherein $C_s$ is a storage capacitance value, $C_{gd}$ is a capacitance value generated from the gate electrode and the drain electrode, $C_{FPL}$ is a capacitance value of a front panel lamination (FPL), $V_{GH}$ is a gate voltage value when the transistor is powered on (e.g. a gate voltage value when currents flow through the scan line), $V_{GL}$ is a gate voltage value when the transistor is powered off (e.g. a gate voltage value when no current flows through the scan line). As shown in this equation, the feed through voltage ΔV is in negative correlation with the storage capacitance value $C_s$. As a result, increase of the storage capacitance value will be beneficial in reducing the feed through voltage.

Therefore, embodiments of the present disclosure achieve reduction of the feed through voltage by increasing the storage capacitance value. In particular, the first insulation layer 400 has a recess 410 vertically above the capacitor electrode 300. In other words, vertical projections of the recess 410 and the capacitor electrode 300 on the top surface 102 of the substrate 100 are overlapped. In some embodiments, the extension electrode 800 extends from the drain electrode 600 into the recess 410, as shown in FIG. 2. In some other embodiments, the extension electrode 800 can extend from the source electrode 700 into the recess 410 as well. As a result, a distance from the extension electrode 800 to the underlying capacitor electrode 300 can be shortened, which increases the storage capacitance value generated from these two electrodes and thus reduces the feed through voltage of the display apparatus.

In some embodiments, as shown in FIG. 2, the first insulation layer 400 includes a gate insulation portion 420 vertically above the gate electrode 200. A thickness of the gate insulation portion 420 is greater than a thickness of a portion of the first insulation layer 400 vertically above the capacitor electrode 300. That is to say, the recess 410 of the first insulation layer 400 can be formed vertically above the capacitor electrode 300 without thinning the gate insulation portion 420. As a result, the gate insulation portion 420 can be kept in a range of thickness sufficient to make the gate electrode 200 withstand high gate voltage.

In some embodiments, the gate insulation portion 420 has a thickness T1, and a bottom surface 411 of the recess 410 and the capacitor electrode 300 are separated by a distance T2. In other words, the distance T2 can be referred to as a thickness of the first insulation layer 400 between the bottom surface 411 and the capacitor electrode 300. As shown in FIG. 2, the thickness T1 of the gate insulation portion 420 is greater than the distance T2 from the bottom surface 411 of the recess 410 to the capacitor electrode 300. In other words, the thickness of a portion of the first insulation layer 400 vertically above the capacitor electrode 300 can be reduced and is less than the thickness T1 because of the recess 410. In this way, the distance between the extension electrode 800 and the capacitor electrode 300 can be shortened to increase the storage capacitance. Moreover, the thickness of the gate insulation portion 420 is not reduced, which is beneficial in high voltage operation. As a result of the thickness T1 greater than the distance T2, either reduction of the feed through voltage or high voltage operation can be achieved.

In some embodiments, the recess 410 can be formed by etching the first insulation layer 400. A depth of the recess 410 can be controlled by tuning etch parameters, such as etchant and/or etch duration. Due to nature of the etching process, the recess 410 tapers in a direction toward the substrate 100. More particularly, the recess 410 has a sidewall 412 standing on the bottom surface 411 of the recess 410. The sidewall 412 and the bottom surface define an angle θ therebetween, wherein the angle θ is an obtuse angle greater than 90 degrees such that the recess 410 tapers in the direction toward the substrate 100.

In some embodiments, as shown in FIG. 2, the sidewall 412 of the recess 410 is vertically above the capacitor electrode 300. Therefore, the entire recess 410 is vertically above the capacitor electrode 300. In other words, a vertical projection of the recess 410 on the top surface 102 of the substrate 100 is completely within the capacitor electrode 300. Such a configuration can make other portions of the first insulation layer 400 not vertically above the capacitor electrode 300 have thicknesses greater than the distance T2. As a result, the first insulation layer 400 can provide enough insulation ability.

As shown in FIG. 2, the recess 410 has a top edge 413. A distance from the top edge 413 to the bottom surface 411 is referred to as a depth D1 of the recess 410. The top edge 413 of the recess 410 is separated by a distance T3 from the capacitor electrode 300. A ratio of the depth D1 to the distance T3 ranges from 1/9 to 7/9, as example. This ratio is beneficial in forming the recess 410 with expected geometry, such that the extension electrode 800 in the recess 410 and the underlying capacitor electrode 300 can generate an expected storage capacitance value.

As shown in FIG. 2, in some embodiments, the distance T3 separating the top edge 413 of the recess 410 and the capacitor electrode 300 may be substantially the same as the thickness T1 of the gate insulation portion 420. Therefore, a ratio of the thickness T1 of the gate insulation portion 420 to the depth D1 of the recess 410 may range from 1/9 to 7/9, as example.

In some embodiments, as shown in FIG. 2, the distance T2 from the bottom surface 411 of the recess 410 to the capacitor electrode 300 ranges from about 1000 angstroms to about 4000 angstroms. In some embodiments, the distance T3 is about 4500 angstroms, and the depth D1 ranges from about 500 angstroms to about 3500 angstroms.

As shown in FIG. 2, since the extension electrode 800 extends into the recess 410, the extension electrode 800 may have a recess 810 within the recess 410. In some embodiments, the recess 810 and the recess 410 have substantially the same shape. In particular, the recess 810 tapers in a direction toward the substrate 100.

In some embodiments, as shown in FIG. 2, the pixel structure further includes a second insulation layer 900. The second insulation layer 900 has first and second portions 910 and 920 connected with each other. The first portion 910 covers the active layer 500, the source electrode 700 and the drain electrode 600. The second portion 920 covers the extension electrode 800. In some embodiments, as shown in FIG. 2, the second portion 920 is conformal to the extension electrode 800. In other words, the second portion 920 may have a recess 921 with a shape substantially the same as that of the recess 810 of the extension electrode 800. More particularly, the recess 921 tapers in a direction toward the substrate 100.

In some embodiments, as shown in FIG. 2, the pixel structure further includes a third insulation layer 1000. The third insulation layer 1000 covers the second insulation layer 900. The third insulation layer 1000 has a capacitor covering portion 1010 vertically above the capacitor electrode 300. The capacitor covering portion 1010 has top and bottom surfaces 1011 and 1012 opposite to each other. The top and bottom surfaces 1011 and 1012 have different shapes. In some embodiments, the top surface 1011 may be a substantially planar surface, and the bottom surface 1012 is conformal to the second portion 920 of the second insulation layer 900. In other words, a portion of the bottom surface 1012 protrudes downward to be embedded in the recess 921 of the second portion 920.

In some embodiments, as shown in FIG. 2, the pixel structure further includes a pixel electrode 1100 penetrating through the third insulation layer 1000 and the second insulation layer 900 and in contact with the drain electrode 600. In some other embodiments, the pixel electrode 1100 may be also in contact with the source electrode 700 rather than the drain electrode 600. A portion 1120 of the pixel electrode 1100 is vertically above the capacitor electrode 300. The portion 1120 of the pixel electrode 1100 is located on a top surface 1011 of the capacitor covering portion 1010 and is thus conformal to the top surface 1011. Because the second portion 920 of the second insulation layer 900 is not conformal to the top surface 1011 of the capacitor covering portion 1010, the portion 1120 of the pixel electrode 1100 and the second portion 920 of the second insulation layer 900 have different shapes. For example, the portion 1120 of the pixel electrode 1100 may be substantially planar.

In some embodiments, the pixel electrode 1100 may include, for example, aluminum, platinum, silver, titanium, molybdenum, zinc, tin, chromium, the like, or other suitable metal or alloy. In some other embodiments, the pixel electrode 1100 may include a transparent conductive material.

FIG. 1 illustrates an exemplary configuration of the recess 410 in top view, wherein the recess 410 has a rectangular contour in top view. In some other embodiments, the recess 410 has a circular contour, an elliptical contour or an otherwise polygonal contour in top view.

Figure 3:
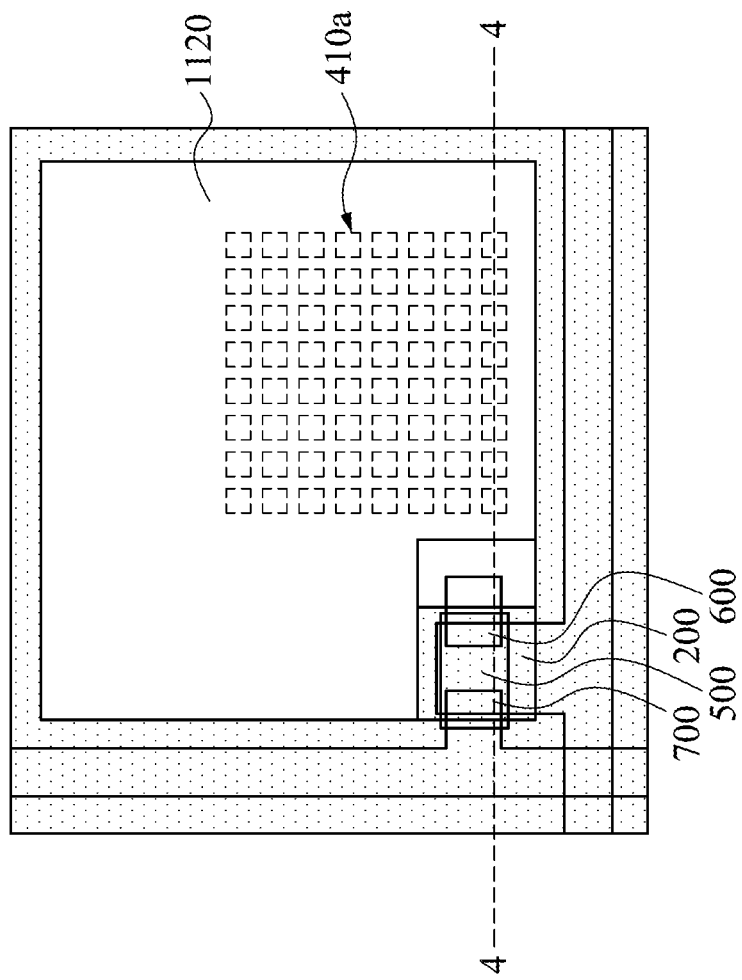
FIG. 3 is a top view of a display apparatus in accordance with some embodiments of the present disclosure.
Figure 4:
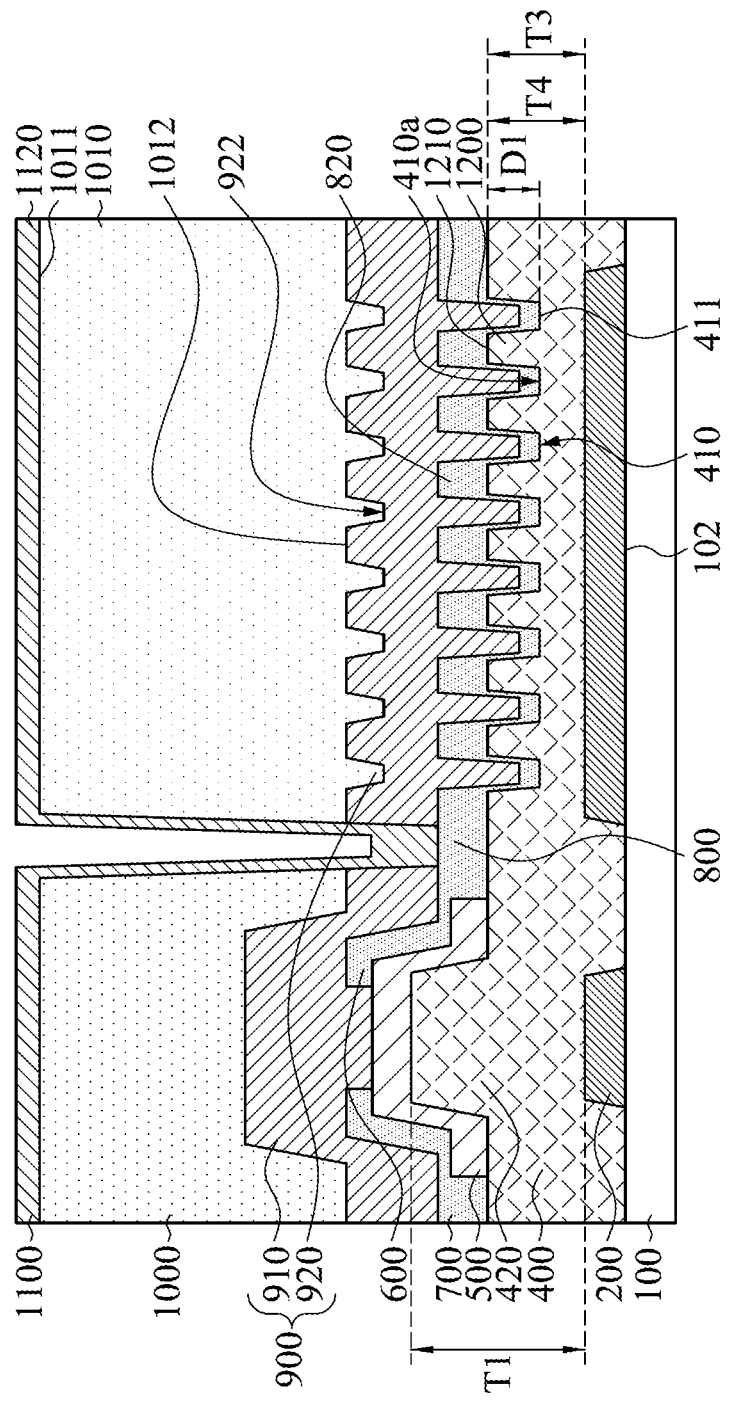
FIG. 4 is a cross-sectional view of the display apparatus taken along line 4 in FIG. 3.

FIG. 3 is a top view of a display apparatus in accordance with some embodiments of the present disclosure. FIG. 4 is a cross-sectional view of the display apparatus taken along line 4 in FIG. 3. A main difference between the pixel structure and the foregoing pixel structures is that the pixel structure as shown in FIG. 3 further includes at least one insulation protrusion 1200 protruding from the bottom surface 411 of the recess 410. In some embodiments, as shown in FIG. 4, a plurality of insulation protrusions 1200 are arranged on the bottom surface 411 of the recess 410 in a spaced apart manner. Other features in FIG. 4 that have been described above with respect to FIGS. 1 and 2 are the same as that in FIGS. 1 and 2, and hence they are not described repeatedly herein for sake of clarity.

In some embodiments, as shown in FIG. 4, the insulation protrusions 1200 and the first insulation layer 400 are monolithically connected (i.e. integrally formed or one-piece formed), and hence a structural strength of a combination of the insulation protrusions 1200 and the first insulation layer 400 can be improved. In other words, the insulation protrusions 1200 and the first insulation layer 400 can include the same material. Therefore, the insulation protrusions 1200 can be formed using an etching process performed to the first insulation layer 400. As a result, amount and arrangement of the insulation protrusions 1200 in the recess 410 can be determined based on an expected storage capacitance value, so that an expected feed through voltage can be achieved. In some embodiments, due to nature of the etching process, the insulation protrusions 1200 expand in a direction toward the substrate 100. In some embodiments, because the insulation protrusions 1200 are formed by the same etching process performed to the first insulation layer 400, the insulation protrusions 1200 may have the same thickness.

In the depicted embodiments, the recess 410 is divided by the insulation protrusions 1200 into a plurality of recesses 410a. In some embodiments, as shown in FIG. 3, the recesses 410a in the pixel structure can be arranged, for example, in rows and columns. In some embodiments, the recess 410a has a rectangular contour, a circular contour, an elliptical contour or an otherwise polygonal contour in top view. Other features in FIGS. 3 and 4 that have been described above with respect to FIGS. 1 and 2 are the same as that in FIGS. 1 and 2, and hence they are not described repeatedly herein for sake of clarity.

In some embodiments, as shown in FIG. 4, a top surface 1210 of the insulation protrusions 1200 is separated by a distance T4 from the capacitor electrode 300. A ratio of the depth D1 of the recess 410 to the distance T4 ranges from ⅕ to ⅞. In some embodiments, the distance T4 is substantially the same as the distance T3.

In some embodiments, as shown in FIG. 4, the extension electrode 800 further includes at least one protrusion 820. The protrusion 820 is vertically above the insulation protrusion 1200 and conformal to the insulation protrusion 1200. As shown in FIG. 4, the extension electrode 800 includes a plurality of protrusions 820 vertically above the insulation protrusions 1200 respectively. Therefore, the extension electrode 800 is undulation-shaped and has a plurality of peaks and troughs arranged in an alternating manner. In some embodiments, since the protrusions 820 are conformal to the insulation protrusions 1200, the protrusions 820 expand in a direction toward the substrate 100 as well.

In some embodiments, as shown in FIG. 4, the second portion 920 of the second insulation layer 900 further includes at least one protrusion 922 vertically above the protrusion 820 and conformal to the protrusion 820. Therefore, as shown in FIG. 4, the second portion 920 is undulation-shaped and has a plurality of peaks and troughs arranged in an alternating manner.

In some embodiments, the bottom surface 1012 of the capacitor covering portion 1010 is conformal to the second portion 920 of the second insulation layer 900. Therefore, the bottom surface 1012 is undulation-shaped and has a plurality of peaks and troughs arranged in an alternating manner.

Figure 5:
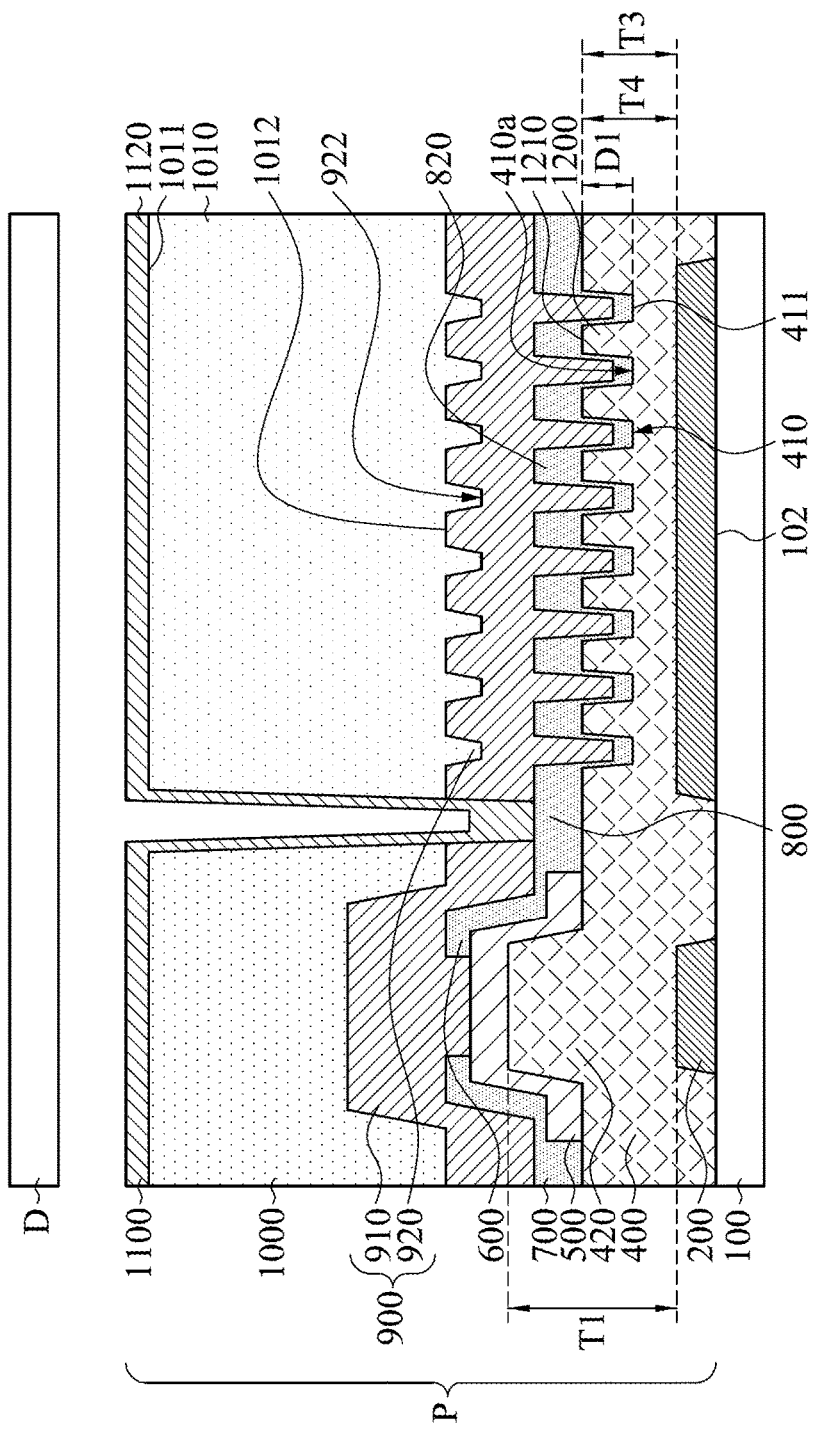
FIG. 5 is a cross-sectional view of a display apparatus in accordance with some embodiments of the present disclosure.

Illustrated in FIG. 5 is a display apparatus according to some embodiments. The display apparatus includes a pixel structure P and a display layer D over the pixel structure P. In the depicted embodiments, the pixel structure P is the same as that in FIG. 4. In other embodiments, another pixel structure discussed above (e.g. the pixel structure as shown in FIG. 2) can be employed to replace the pixel structure P. The display layer D includes, for example, a bi-stable display medium layer (e.g. an electrophoretic layer) or other suitable display medium layers (e.g. a liquid crystal layer, an organic light emitting diode (OLED) layer, or the like).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A pixel structure, comprising:
a substrate;
a gate electrode disposed on the substrate;
a capacitor electrode disposed on the substrate and spaced apart from the gate electrode;
a first insulation layer covering the gate electrode and the capacitor electrode, the first insulation layer having at least two recesses vertically above the capacitor electrode;
an active layer disposed on the first insulation layer;
drain and source electrodes disposed on the active layer and spaced apart from each other; and
an extension electrode extending from the drain electrode or the source electrode into the recesses.

2. The pixel structure of claim 1, wherein the first insulation layer comprises a gate insulation portion vertically above the gate electrode, and a thickness of the gate insulation portion is greater than a distance from a bottom surface of one of the recesses to the capacitor electrode.

3. The pixel structure of claim 1, wherein one of the recesses has a sidewall vertically above the capacitor electrode.

4. The pixel structure of claim 1, wherein one of the recesses has a depth, and a top edge of the one of the recesses and the capacitor electrode are separated by a distance, and a ratio of the depth to the distance ranges from 1/9 to 7/9.

5. The pixel structure of claim 1, wherein a bottom surface of one of the recesses is separated by a distance from the capacitor electrode, and the distance ranges from about 1000 angstroms to about 4000 angstroms.

6. The pixel structure of claim 1, wherein the first insulation layer further comprises at least one insulation protrusion protruding from a bottom surface of one of the recesses.

7. The pixel structure of claim 6, wherein the insulation protrusion and the first insulation layer are monolithically connected.

8. The pixel structure of claim 6, wherein a plurality of the at least one insulation protrusions are arranged on the bottom surface of the one of the recesses in a spaced apart manner.

9. The pixel structure of claim 8, wherein the insulation protrusions have the same thickness.

10. The pixel structure of claim 6, wherein the one of the recesses has a depth, and a top surface of the insulation protrusion is separated by a distance from the capacitor electrode, and a ratio of the depth to the distance ranges from 1/9 to 7/9.

11. The pixel structure of claim 6, wherein the extension electrode further extends to over the insulation protrusion.

12. The pixel structure of claim 1, wherein the extension electrode is undulation-shaped and has a plurality of peaks and troughs arranged in an alternating manner.

13. The pixel structure of claim 1, further comprising:
a second insulation layer having first and second portions connected with each other, the first portion covering the active layer, the source electrode and the drain electrode, the second portion covering the extension electrode, and the second portion being undulation-shaped and having a plurality of peaks and troughs arranged in an alternating manner.

14. The pixel structure of claim 13, further comprising:
a third insulation layer covering the second insulation layer, wherein the third insulation layer has a capacitor covering portion vertically above the capacitor electrode, the capacitor covering portion has top and bottom surfaces opposite to each other, and the top and bottom surfaces have different shapes.

15. The pixel structure of claim 14, wherein the bottom surface of the capacitor covering portion is conformal to the second portion of the second insulation layer.

16. The pixel structure of claim 13, further comprising:
a pixel electrode penetrating through the second insulation layer and in contact with the source electrode or the drain electrode, wherein a portion of the pixel electrode is vertically above a portion of the capacitor electrode, and the portion of the capacitor electrode has a shape different from a shape of the second portion of the second insulation layer.

17. A pixel structure, comprising:
a substrate;
a gate electrode disposed on the substrate;
a capacitor electrode disposed on the substrate and spaced apart from the gate electrode;
a first insulation layer covering the gate electrode and the capacitor electrode, a thickness of the first insulation layer vertically above the gate electrode being greater than that vertically above the capacitor electrode, the first insulation layer having at least one recess vertically above the capacitor electrode and at least one first protrusion adjacent to the recess;
an active layer disposed on the first insulation layer; and
drain and source electrodes disposed on the active layer and spaced apart from each other.

18. The pixel structure of claim 17, wherein the first insulation layer has a plurality of second protrusions vertically above the capacitor electrode.

19. A display apparatus, comprising:
a pixel structure, comprising:
a substrate;
a gate electrode disposed on the substrate;
a capacitor electrode disposed on the substrate and spaced apart from the gate electrode;
a first insulation layer covering the gate electrode and the capacitor electrode, the first insulation layer having at least two recesses vertically above the capacitor electrode;
an active layer disposed on the first insulation layer;
drain and source electrodes disposed on the active layer and spaced apart from each other; and
an extension electrode extending from the drain electrode or the source electrode into the recesses; and
a display layer over the pixel structure.

* * * * *